United States Patent
Petrmichl et al.

(10) Patent No.: US 8,153,266 B2
(45) Date of Patent: Apr. 10, 2012

(54) HEAT TREATABLE COATED ARTICLE WITH ZINC DOPED ZIRCONIUM BASED LAYER(S) IN COATING

(75) Inventors: Rudolph Hugo Petrmichl, Ann Arbor, MI (US); Douglas Klimesh, Ypsilanti, MI (US); Jiangping Wang, Novi, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 202 days.

(21) Appl. No.: 12/591,640

(22) Filed: Nov. 25, 2009

(65) Prior Publication Data

US 2010/0075156 A1    Mar. 25, 2010

Related U.S. Application Data

(62) Division of application No. 11/489,729, filed on Jul. 20, 2006, now Pat. No. 7,645,487.

(51) Int. Cl.
*B32B 17/06* (2006.01)

(52) U.S. Cl. ......... 428/432; 428/689; 428/698; 428/702

(58) Field of Classification Search ............ None
See application file for complete search history.

(56) References Cited

U.S. PATENT DOCUMENTS

| | | | |
|---|---|---|---|
| 6,303,225 B1 | 10/2001 | Veerasamy | |
| 6,303,226 B2 | 10/2001 | Veerasamy | |
| 6,921,579 B2 | 7/2005 | O'Shaughnessy et al. | |
| 7,060,322 B2 | 6/2006 | Veerasamy | |
| 7,645,487 B2 | 1/2010 | Petrmichl et al. | |
| 2005/0048284 A1 | 3/2005 | Veerasamy | |
| 2005/0095430 A1 | 5/2005 | Veerasamy | |
| 2005/0095431 A1 | 5/2005 | Veerasamy | |
| 2005/0191494 A1 | 9/2005 | Veerasamy | |
| 2006/0057294 A1 | 3/2006 | Veerasamy et al. | |
| 2006/0240266 A1 | 10/2006 | Schicht et al. | |

FOREIGN PATENT DOCUMENTS

| | | |
|---|---|---|
| EP | 1 065 180 | 1/2001 |
| FR | 2 856 627 | 12/2004 |
| FR | 2 858 975 | 2/2005 |
| FR | 2 869 897 | 11/2005 |

OTHER PUBLICATIONS

U.S. Appl. No. 11/489,729, filed Jul. 20, 2006; Petrmichl et al.
International Search Report dated Nov. 5, 2007.

*Primary Examiner* — Ling Xu
(74) *Attorney, Agent, or Firm* — Nixon & Vanderhye P.C.

(57) ABSTRACT

In certain example embodiments, a coated article includes a Zn-doped zirconium based layer before heat treatment (HT). The coated article is heat treated sufficiently to cause the Zn-doped zirconium based layer to transform into a Zn-doped zirconium oxide based layer that is scratch resistant and/or chemically durable. The doping of the layer with Zn has been found to improve scratch resistance and/or corrosion resistance.

14 Claims, 4 Drawing Sheets

| Ex. | Configuration | Top layer thikness A | Scratch resistance lb. | Tvis% | Top layer after corrosion testing |
|---|---|---|---|---|---|
| CE1 | 6mm clear glass (1) | none | 0.4 | 89.15 | n/a |
| CE2 | 140 A Si3N4 on 6 mm extra clear glass (2) | none | <0.4 | 89.16 | n/a |
| CE3 | ZrOx on substr. 1 | ~420 | 10 | 79.1 | nm |
| CE4 | ZrOx on substr. 2 | ~420 | 10 | 78.2 | nm |
| CE5 | ZnOx on substr. 1 | 30 | 2.5 | 89.0 | 0 |
| CE6 | ZnOx on substr. 2 | 35 | 5 | 89.2 | 0 |
| CE7 | ZnOx on substr. 1 | 415 | <15 | 82.6 | 0 |
| CE8 | ZnOx on substr. 2 | 365 | 15 | 78.0 | 0 |
| 1 | ZnZrOx on substr. 1 | 84 | 15 | 87.5 | 98 |
| 2 | ZnZrOx on substr. 2 | 118 | 30 | 86.0 | 103 |
| 3 | ZnZrOx on substr. 1 | 340 | 30 | 77.4 | 331 |
| 4 | ZnZrOx on substr. 2 | 370 | 35 | 76.1 | 364 |

FIG. 6

HEAT TREATABLE COATED ARTICLE WITH ZINC DOPED ZIRCONIUM BASED LAYER(S) IN COATING

This application is a divisional of application Ser. No. 11/489,729, filed Jul. 20, 2006, now U.S. Pat. No. 7,645,487, the entire disclosure of which is hereby incorporated herein by reference in this application.

This invention relates to a method of making a coated article to be used in a window unit or any other suitable application such as furniture glass, display case glass, picture frame glass, or the like. For example, certain embodiments of this invention relate to a method of making a coated article including a step of heat treating a glass substrate coated with at least a layer comprising zirconium (Zr) oxide and/or nitride doped with zinc (Zn). Following heat treatment, the coated article includes a glass substrate supporting at least a layer comprising zirconium oxide doped with zinc; where the layer structure is transformed due to the heat treatment.

Optionally, DLC may be provided over the Zn-doped zirconium based layer prior to heat treatment. DLC may be used to generate energy during heat treatment (HT) for transforming at least another layer in the coating so as to form a new post-HT layer(s) (e.g., Zn-doped zirconium oxide based layer) which may not have been present before the heat treatment. Optionally, a dielectric barrier layer comprising silicon nitride, silicon oxide, or the like may be provided under the Zr-based layer so as to be located between at least the glass substrate and the Zr-based layer.

Certain other example embodiments of this invention relate to such a coated article, heat treated or not, which may be used in window applications, or any other suitable application such as furniture glass, display case glass, or the like.

BACKGROUND OF THE INVENTION

Vehicle windows (e.g., windshields, backlites, sunroofs, and sidelites) are known in the art. For purposes of example, vehicle windshields typically include a pair of bent glass substrates laminated together via a polymer interlayer such as polyvinyl butyral (PVB). It is known that one of the two glass substrates may have a coating (e.g., low-E coating) thereon for solar control purposes such as reflecting IR and/or UV radiation, so that the vehicle interior can be more comfortable in certain weather conditions. Conventional vehicle windshields are made as follows. First and second flat glass substrates are provided, one of them optionally having a low-E coating sputtered thereon. The pair of glass substrates are washed and booked together (i.e., stacked on one another), and then while booked are heat bent together into the desired windshield shape at a high temperature(s) (e.g., 8 minutes at about 600-625 or more degrees C.). The two bent glass substrates are then laminated together via the polymer interlayer to form the vehicle windshield.

Insulating glass (IG) window units are also known in the art. Conventional IG window units include at least first and second glass substrates (one of which may have a solar control coating on an interior surface thereof) that are coupled to one another via at least one seal(s) or spacer(s). The resulting space or gap between the glass substrates may or may not be filled with gas and/or evacuated to a low pressure in different instances. However, many IG units are required to be tempered. Thermal tempering of the glass substrates for such IG units typically requires heating the glass substrates to temperature(s) of at least about 600 degrees C. for a sufficient period of time to enable thermal tempering.

Other types of coated articles also require heat treatment (HT) (e.g., tempering, heat bending, and/or heat strengthening) in certain applications. For example and without limitation, glass shower doors, glass table tops, and the like require HT in certain instances.

Diamond-like carbon (DLC) is sometimes known for its scratch resistant properties. For example, different types of DLC are discussed in the following U.S. Pat. Nos. 6,303,226, 6,303,225, and so forth, which are hereby incorporated herein by reference.

It would sometimes be desirable to provide a window unit or other glass article with a protective coating including DLC in order to protect it from scratches and the like. Unfortunately, DLC tends to oxidize and burn off at temperatures of from approximately 350 degrees C. (possibly from 380 to 400 degrees C.) or higher, as the heat treatment is typically conducted in an atmosphere including oxygen. Thus, it will be appreciated that DLC as a protective overcoat cannot withstand heat treatments (HT) at the extremely high temperatures described above which are often required in the manufacture of vehicle windows, IG window units, glass table tops, tempered glass articles, and/or the like. Accordingly, DLC cannot be used alone as a coating to be heat treated, because it will oxidize during the heat treatment and substantially disappear as a result of the same (i.e., it will burn off).

Certain other types of scratch resistant materials also are not capable of withstanding heat treatment sufficient for tempering, heat strengthening and/or bending of an underlying glass substrate.

Accordingly, those skilled in the art will appreciate that a need in the art exists for a method of making a scratch resistant coated article that is capable of being heat treated (HT) so that after heat treatment the coated article is still scratch resistant. A need for corresponding coated articles, both heat treated and pre-HT, also exists.

U.S. Patent Document 2006/0057294 (hereby incorporated herein by reference), commonly owned with the instant application, discloses a coated article including a zirconium nitride based layer and optionally a layer comprising DLC. Heat treatment (e.g., thermal tempering) of the coated article causes the zirconium nitride based layer to transform into a scratch resistant zirconium oxide based layer. While heat treated coated articles of the '294 document are good and realize satisfactory results in many instances, there is room for improvement with respect to scratch resistance (SR).

BRIEF SUMMARY OF EXAMPLES OF INVENTION

In certain example embodiments of this invention, there is provided a method of making a coated article (e.g., window unit such as for a vehicle, building, or the like) that is capable of being heat treated so that after being heat treated (HT) the coated article is scratch resistant to an extent more than uncoated glass.

In certain example embodiments of this invention, prior to heat treatment a coated article includes at least a layer(s) of or including Zn-doped zirconium oxide and/or nitride on a glass substrate. This may be the only layer on the glass substrate in certain example embodiments, or alternatively other layers may be present. For instance, one or more layers of diamond-like carbon (DLC) may be present on the glass substrate over at least the Zn-doped zirconium based layer. As another example, a dielectric barrier layer may be present between the glass substrate and the Zn-doped zirconium based layer. Heat treatment (e.g., thermal tempering) of the coated article causes the Zn-doped zirconium based layer to transform into a layer of or including Zn-doped zirconium oxide that can be used for scratch resistant and/or corrosion resistant purposes.

Surprisingly, it has been found that the addition of the zinc (Zn) to the zirconium based layer remarkably improves the scratch resistance of the layer following heat treatment, compared to if the Zn is not present. Unexpectedly, it has been found that the addition of the zinc (Zn) to the zirconium based layer remarkably improves the scratch resistance of the layer, before and/or after heat treatment, compared to a pure ZrO coating on a glass substrate, and also compared to a pure ZnO coating on a glass substrate. Furthermore, it has been unexpectedly found that the addition of the zinc (Zn) to the zirconium based layer improves the corrosion resistance of the coated article, before and/or after heat treatment, compared to a ZnO coating and is able to withstand exposure to corrosive environments which would dissolve pure zinc oxide. Thus, a coated article with improved scratch resistance (SR) and improved corrosion resistance/chemical stability is provided.

In certain example instances, that are not limiting, the Zn-doped zirconium oxide inclusive layer following heat treatment may be buffed or surface treated in order to improve scratch resistance thereof. Moreover, the zirconium inclusive layer may additionally be doped with other materials such as F in certain example non-limiting instances.

In certain example embodiments, an optional layer of diamond-like carbon (DLC) may be provided on the glass substrate over at least the zirconium inclusive layer prior to heat treatment, for purposes of protecting the zirconium inclusive layer prior to heat treatment (HT). In certain example embodiments, the DLC may be hydrogenated. The HT causes the layer comprising Zn-doped zirconium oxide and/or nitride to be transformed into a new post-HT layer comprising Zn-doped zirconium oxide, and optionally causes any optional DLC layer to burn off or combust. During HT, the optional DLC layer(s) will be oxidized and burn off, however, the new post-HT layer may contain some residual carbon. The new post-HT layer comprising Zn-doped zirconium oxide may also include nitrogen in certain example embodiments of this invention.

In certain example embodiments, at least prior to heat treatment, the layer(s) comprising zirconium nitride may also be doped with fluorine (F) and/or carbon (C). Surprisingly, it has been found that this tends to increase the visible transmission of the heat treated coated article.

The new post-HT layer comprising Zn-doped zirconium oxide is very scratch resistant. Thus, it can be seen that a technique has been provided which allows for a heat treatable scratch resistant product which is also corrosion resistant; and the coated article may also have good transmission properties. In certain example embodiments, the scratch resistance of the post-HT coated article may even be better than that of non-HT DLC.

In certain example embodiments, there is provided a method of making a heat treated coated article, the method comprising: providing a coating supported by a glass substrate, the coating comprising a layer comprising zirconium and zinc; and thermally tempering the glass substrate with the layer comprising zirconium and zinc thereon, so that after the tempering a layer comprising zinc-doped zirconium oxide is provided on the glass substrate.

In other example embodiments of this invention, there is provided a method of making a coated article, the method comprising: providing a coating supported by a substrate, the coating comprising a layer comprising zirconium and zinc; and heat treating the substrate with the layer comprising zirconium and zinc thereon, so that after the tempering a layer comprising oxide of Zn and Zr is provided as an outermost layer of the coated article.

In still further example embodiments of this invention, there is provided a coated article comprising: a glass substrate; and a layer comprising Zn-doped zirconium oxide provided as an outermost layer of a coating provided on the glass substrate.

BRIEF DESCRIPTION OF THE DRAWINGS

FIG. 6 is a graph/chart illustrating certain examples that were made and tested according to certain example embodiments of this invention.

DETAILED DESCRIPTION OF EXAMPLE EMBODIMENTS OF THE INVENTION

Figure 1:
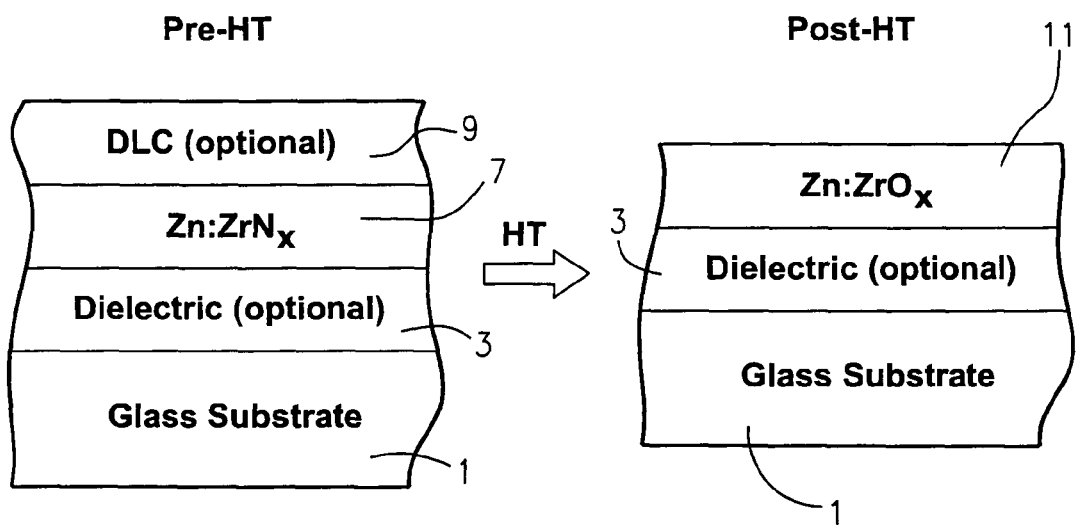
FIG. 1 is a schematic diagram illustrating cross-sections of coated articles according to an embodiment of this invention before and after heat treatment.

Referring now more particularly to the accompanying drawings in which like reference numerals indicate like parts or layers throughout the several views.

In certain example embodiments of this invention, prior to heat treatment a coated article includes at least one layer(s) of or including Zn-doped zirconium oxide and/or nitride on a glass substrate. This may be the only layer on the glass substrate in certain example embodiments, or alternatively other layers may be present. For instance, one or more layers of diamond-like carbon (DLC) may be present on the glass substrate over at least the Zn-doped zirconium based layer prior to heat treatment in certain instances. As another example, a dielectric barrier layer may be present between the glass substrate and the Zn-doped zirconium based layer before and/or after heat treatment. Heat treatment (e.g., thermal tempering) of the coated article causes the Zn-doped zirconium based layer to transform into a layer of or including Zn-doped zirconium oxide that can be used for scratch resistant and/or corrosion resistant purposes. In certain example embodiments, the top layer of the coating following heat treatment consists essentially of zinc-doped zirconium oxide ($Zn:ZrO_x$) which is both scratch resistant (SR) and corrosion resistant. Other layer(s), in addition to the Zn-doped zirconium based layer, may or may not be provided in different example embodiments of this invention.

Surprisingly, it has been found that the addition of the zinc (Zn) to the zirconium based layer remarkably improves the scratch resistance of the layer, compared to if the Zn is not present. Unexpectedly, it has been found that the addition of the zinc (Zn) to the zirconium based layer remarkably improves the scratch resistance of the layer, before and/or after heat treatment, compared to a pure ZrO coating on a glass substrate, and also compared to a pure ZnO coating on a glass substrate. Furthermore, it has been unexpectedly found that the addition of the zinc (Zn) to the zirconium based layer improves the corrosion resistance of the coated article, before and/or after heat treatment, compared to a ZnO coating and is able to withstand exposure to corrosive environments which would dissolve pure zinc oxide. Thus, a coated article with improved scratch resistance (SR) and improved corrosion resistance/chemical stability is provided. Accordingly, a transparent lubricious coating is provided for glass and ceramic substrates, comprising Zr, Zn and oxygen with scratch resistance better than that of pure zirconium oxide, and with chemical stability and scratch resistance better than pure zinc oxide.

In certain example embodiments of this invention, the Zn-doped zirconium based layer may be of or include one or more of: $Zn:ZrO_x$, $Zn:ZrN_x$, $Zn:ZrO_xN_y$, $Zn:ZrB_x$, $Zn:ZrC_x$, or mixtures thereof, prior to heat treatment. In certain embodiments, the heat treatment (HT) may involve heating a supporting glass substrate, with at least the Zn-doped zirconium based layer(s) thereon, using temperature(s) of from 550 to 800 degrees C., more preferably from 580 to 800 degrees C. (which is well above the burn-off temperature of DLC). The high temperature developed during the HT heats the Zn-doped zirconium based layer(s) and causes the layer to transform into Zn-doped zirconium oxide ($Zn:ZrO_x$) based layer as a result of the HT. Nitrogen, fluorine and/or carbon may optionally be present in the final post-HT layer in certain example embodiments.

In certain example embodiments of this invention, the post-HT layer(s) comprising Zn-doped zirconium oxide includes a nanocrystalline cubic lattice structure. The entire layer(s) may be of a nanocrystalline cubic lattice structure type, or alternatively only part of the layer(s) may include nanocrystalline cubic lattice structure post-HT. Prior to HT, the layer need not have a nanocrystalline cubic lattice structure. Thus, it will be appreciated that the HT causes the Zn-doped zirconium based layer to transform into a Zn-doped zirconium oxide ($Zn:ZrO_x$) based layer having a nanocrystalline cubic lattice structure. In certain example embodiments, as a result of the HT, the amount of oxygen in the post-HT zirconium inclusive layer(s) is higher than the amount of oxygen in the pre-HT zirconium inclusive layer(s). Instead of a nanocrystalline cubic lattice structure, it is optional that post-HT layer(s) comprising Zn-doped zirconium oxide includes a nanocrystalline tetragonal structure in any embodiment of this invention (i.e., cubic may be replaced with tetragonal in any embodiment herein).

In certain example embodiments of this invention, there is more Zr than Zn in the Zn-doped zirconium oxide based layer. Thus, the layer is said to be Zn-doped. In certain example embodiments of this invention, the Zn-doped zirconium based layer (e.g., $Zn:ZrO_x$, $Zn:ZrN_x$, $Zn:ZrO_xN_y$, $Zn:ZrB_x$, and/or $Zn:ZrC_x$) may contain less than 50% Zn (relative to its metal content which is Zn+Zr). The metal content of the layer may be from about 2-50% Zn in certain example embodiments of this invention, more preferably from about 3-40% Zn, even more preferably from about 5-25% Zn, and most preferably from about 10-20% Zn. For purposes of example, a $Zn:ZrO_x$ layer containing 15% Zn has 85% Zr, and is also oxided as discussed herein (i.e., oxygen is not included in the metal content). In certain example embodiments of this invention, the Zr:Zn ratio in the Zn-doped zirconium based layer (e.g., $Zn:ZrO_x$, $Zn:ZrN_x$, $Zn:ZrO_xN_y$, $Zn:ZrB_x$, and/or $Zn:ZrC_x$) may be from about 50:1 to 1:1, more preferably from about 40:1 to 1.5:1, even more preferably from about 20:1 to 4:1, and still more preferably from about 10:1 to 5:1.

Moreover, in certain example embodiments of this invention, the Zn-doped zirconium oxide based layer may be from about 1 to 250 nm thick, more preferably from about 1 to 100 nm thick, and most preferably from about 5 to 50 nm thick in certain example embodiments of this invention, when high transmission is desired. An example thickness is about 300 angstroms. In certain example embodiments of this invention, coated articles herein have a visible transmission of at least about 60% (before and/of after HT), more preferably at least about 70%, and possibly at least about 75% or 80%.

In certain example embodiments, at least prior to heat treatment, one or more of the Zn-doped zirconium oxide based layer may also be doped with fluorine (F) and/or carbon (C). This may be done, for example, by using a gas such as $C_2F_6$ during sputter-deposition of the Zn-doped zirconium oxide based layer. Surprisingly, it has been found that doping the Zn-doped zirconium oxide based layer with F and/or C prior to heat treatment tends to increase the visible transmission of the heat treated coated article. Of course, following heat treatment the Zn-doped zirconium oxide based layer may also be doped with F and/or C in a corresponding manner since it was present before HT. This doping with F and/or C may be used in conjunction with any embodiment discussed herein.

The Zn-doped zirconium based layer (e.g., $Zn:ZrO_x$, $Zn:ZrN_x$, $Zn:ZrO_xN_y$, $Zn:ZrB_x$, and/or $Zn:ZrC_x$) may be deposited on the glass substrate (including optionally over a dielectric or other type of barrier layer(s)) by any suitable technique including but not limited to PVD and CVD. Sputter deposition is appropriate in certain example instances. The coating may be used in in-deposited form (i.e., no tempering or the like), but is typically heat treated at the high temperatures discussed herein (e.g., for tempering, heat bending and/or heat strengthening) to densify the Zn-doped zirconium based layer and reduce its absorption. The coating may be heat treated in a standard furnace used to temper glass in certain example instances. If, for example, the coated article is to be used in its as-deposited form, the Zn-doped zirconium based layer may be deposited using a mixed zinc and zirconium metal or ceramic sputtering target, or alternatively may be formed by merging single zinc and zirconium sources (e.g., co-sputtering a Zn or ZnO target, and a Zr or ZrO target). If, for example, the coated article is to be used following HT, it can be made in a similar manner except that HT is used, or alternatively it can be made from discrete Zn and Zr containing layers and the mixed Zn:Zr oxide following HT may be formed by diffusion which occurs during the HT. Optionally, a sacrificial layer comprising carbon or DLC may be provided on the glass substrate over the Zn-doped zirconium based layer for mechanical protection prior to HT (this carbon inclusive layer typically burns off during HT).

FIG. 1 is a schematic diagram illustrating how a coated article can be made according to another example embodiment of this invention. Initially, a coated article is formed using a glass substrate 1. The coated article includes, supported by glass substrate 1, at least one optional dielectric barrier layer 3 of or including silicon nitride, silicon oxynitride, silicon oxide, or the like; at least one layer of or including Zn-doped zirconium nitride 7 (e.g., Zn:ZrN, or any other suitable stoichiometry), and an optional top layer of or including DLC 9.

Glass substrate 1 is typically of or includes soda-lime-silica glass, although other types of glass may be used in certain instances. Dielectric layer(s) 3 is provided in order to prevent or reduce sodium diffusion into the Zn-doped zirconium based layer 7 during HT (i.e., a diffusion barrier). Any of the aforesaid barrier layer 3 materials may be doped (e.g., 0.5 to 15%) with Al, stainless steel, or any other metal(s) in certain embodiments of this invention. Barrier layer(s) 3 is formed on the glass substrate 1 via sputtering, or via any other suitable technique. Dielectric barrier layer 3 may be from about 50 to 900 Å thick in certain example embodiments of this invention, more preferably from about 80-700 Å thick, and most preferably from about 100 to 400 Å thick (e.g., about 150 angstroms thick).

The layer 9 comprising DLC may be of any suitable type of DLC, including but not limited to any of the DLC types described in any of U.S. Pat. Nos. 6,592,993; 6,592,992; 6,531,182; 6,461,731; 6,447,891; 6,303,226; 6,303,225; 6,261,693; 6,338,901; 6,312,808; 6,280,834; 6,284,377; 6,335,086; 5,858,477; 5,635,245; 5,888,593; 5,135,808; 5,900,342; and/or 5,470,661, all of which are hereby incorporated herein by reference. For purposes of example only, DLC inclusive layer(s) 9 may be from about 5 to 1,000 angstroms (Å) thick in certain example embodiments of this invention, more preferably from 10-300 Å thick, and most preferably from 25 to 50 Å thick. In certain example embodiments of this invention, DLC layer(s) 9 may have an average hardness of at least about 10 GPa, more preferably at least about 20 GPa, and most preferably from about 20-90 GPa. Such hardness renders layer 9 resistant to scratching, certain solvents, and/or the like, before the sacrificial layer 9 burns off during HT. Layer 9 may, in certain example embodiments, be of or include a special type of DLC known as highly tetrahedral amorphous carbon (t-aC), and may be hydrogenated (t-aC:H) in certain embodiments. In certain hydrogenated embodiments, the t-aC:H type of DLC 9 may include from 4 to 39% hydrogen, more preferably from 5-30% H, and most preferably from 10-20% H. This t-aC or t-aC:H type of DLC for layer(s) 5 and/or 9 may include more $sp^3$ carbon—carbon (C—C) bonds than $sp^2$ carbon—carbon (C—C) bonds. In certain example embodiments, at least about 50% of the carbon-carbon bonds in DLC layer 9 may be $sp^3$ type carbon—carbon (C—C) bonds, more preferably at least about 60% of the carbon-carbon bonds in the layer(s) may be $sp^3$ carbon—carbon (C—C) bonds, and most preferably at least about 70% of the carbon-carbon bonds in the layer(s) may be $sp^3$ carbon—carbon (C—C) bonds. In certain example embodiments of this invention, the DLC in layer 9 may have an average density of at least about 2.4 $gm/cm^3$, more preferably at least about 2.7 $gm/cm^3$. Example linear ion beam sources that may be used to deposit DLC inclusive layer 9 on substrate 1 include any of those in any of U.S. Pat. Nos. 6,261,693, 6,002,208, 6,335,086, or 6,303,225 (all incorporated herein by reference). When using an ion beam source to deposit layer 9, hydrocarbon feedstock gas(es) (e.g., $C_2H_2$), HMDSO, or any other suitable gas, may be used in the ion beam source in order to cause the source to emit an ion beam toward substrate 1 for forming layer 9. It is noted that the hardness and/or density of layer 9 may be adjusted by varying the ion energy of the depositing apparatus. In certain example embodiments, at least about 2,000 V (anode to cathode volts), e.g., about 3,000 V, may be used in the ion source in depositing layer 9. It is noted that the phrase "on the substrate" as used herein is not limited to being in direct contact with the substrate as other layer(s) may still be provided therebetween.

Zn-doped zirconium nitride inclusive layer 7 is provided on the glass substrate 1, and optionally between DLC layer 9 and dielectric barrier layer 3 in the FIG. 1 embodiment. In certain example embodiments, Zn-doped zirconium nitride inclusive layer 7 may be located directly between DLC layer 9 and barrier layer 3 so as to contact each of them; however in other example embodiments other layer(s) (not shown) may be provided therebetween. The Zn-doped zirconium nitride inclusive layer 7 may consist essentially of zinc, zirconium and nitride, or alternatively may include other materials including but not limited to oxygen, or other dopants such as Al, F, C or the like. Zn-doped zirconium nitride inclusive layer 7 may be formed by sputtering or the like in certain example embodiments of this invention. As discussed above, in certain example embodiments of this invention the Zr:Zn ratio in the Zn-doped zirconium based layer 7 (and in post-HT layer 11) (e.g., $Zn:ZrO_x$, $Zn:ZrN_x$, $Zn:ZrO_xN_y$, $Zn:ZrB_x$, and/or $Zn:ZrC_x$) may be from about 50:1 to 1:1, more preferably from about 40:1 to 1.5:1, even more preferably from about 20:1 to 4:1, and still more preferably from about 10:1 to 5:1. Moreover, in certain example embodiments of this invention, Zn-doped zirconium nitride inclusive layer 7 may have a density of at least 6 $gm/cm^3$, more preferably at least 7 $gm/cm^3$. Additionally, in certain example embodiments, Zn-doped zirconium nitride layer 7 may have an average hardness of at least 650 kgf/mm, more preferably of at least 700 kgf/mm, and/or may have a bond overlap population of at least 0.25 (more preferably at least about 0.30) for strength purposes. In certain example instances, many of the Zr—N bonds in layer 7 may be of the covalent type, which are stronger than ionic bonds, for strength purposes. In certain example embodiments of this invention, the Zn-doped zirconium nitride of layer 7 may be represented by $Zn:Zr_xN_y$, where the ratio x:y is from about 0.5 to 1.3, more preferably from about 0.8 to 1.2, and may be about 1.0 in certain example embodiments.

Once the pre-HT coated article shown on the left side of FIG. 1 is formed, it may or may not be subjected to heat treatment sufficient for at least one of heat bending, thermal tempering, and/or heat strengthening. Referring to FIG. 1, when subjected to HT (e.g., in a furnace using temperature(s) of from 550 to 800 degrees C., more preferably from 580 to 800 degrees C.), the upper or outer DLC inclusive layer 9 burns off due to combustion because of the high temperatures used during HT. The high temperature heats the layer 7 comprising Zn-doped zirconium nitride to a temperature(s) sufficient to cause the layer to densify and increase its visible transmission by decreasing its absorption. Because the layer comprising Zn-doped zirconium nitride 7 is heated to such a high temperature during HT, the layer 7 is transformed during the HT into a new post-HT layer comprising or consisting essentially of Zn-doped zirconium oxide 11. The new post-HT layer comprising Zn-doped zirconium oxide 11 may also include nitrogen (and/or other dopants) in certain example embodiments of this invention (e.g., Zn:ZrO:N; $Zn:ZrO_2$:N; or any other suitable stoichiometry). The new post-HT layer comprising Zn-doped zirconium oxide 11 (optionally with nitrogen) is surprisingly scratch resistant thereby providing a heat treated scratch resistant coated article. It is noted that the phrase "zirconium oxide" as used herein includes $ZrO_2$ and/or any other stoichiometry where Zr is at least partially oxidized. The post-HT layer comprising Zn-doped zirconium oxide 11 may include from 0-30% nitrogen in certain example embodiments of this invention, more preferably from 0-20% nitrogen, even more preferably from 0-10% nitrogen, and possibly from about 1-5% nitrogen in certain example embodiments of this invention. In certain example embodiments of this invention, the post-HT layer comprising Zn-doped zirconium oxide 11 includes a nanocrystalline cubic lattice or tetragonal structure (although the pre-HT layer comprising Zn-doped zirconium nitride did not in certain instances). In certain example embodiments of this invention, the heat treated layer 11 comprising Zn-doped zirconium oxide includes $Zn:Zr_xO_y$, wherein y/x is from about 1.2 to 2.5, more preferably from about 1.4 to 2.1.

As explained above, it has been found that the addition of the zinc (Zn) to the zirconium based layer 7 (and 11) remarkably improves the scratch resistance of the layer following heat treatment, compared to if the Zn is not present. Unexpectedly, it has been found that the addition of the zinc (Zn) to the zirconium based layer 7 (and 11) remarkably improves the scratch resistance of the layer and thus of the coated article, before and/or after heat treatment, compared to a pure ZrO coating on a glass substrate, and also compared to a pure ZnO coating on a glass substrate. Furthermore, it has been unexpectedly found that the addition of the zinc (Zn) to the zirconium based layer 7 (and 11) improves the corrosion resistance of the coated article, before and/or after heat treatment (HT), compared to a ZnO coating and is able to withstand exposure to corrosive environments which would dissolve pure zinc oxide. Thus, a coated article with improved scratch resistance (SR) and improved corrosion resistance/chemical stability is provided.

The final HT (or even the non-HT) coated article of FIG. 1 is scratch resistant and may be used in various applications, including but not limited to IG window units, laminated vehicle windshields, other types of vehicle windows, furniture applications, display glass, and/or the like.

Figure 2:
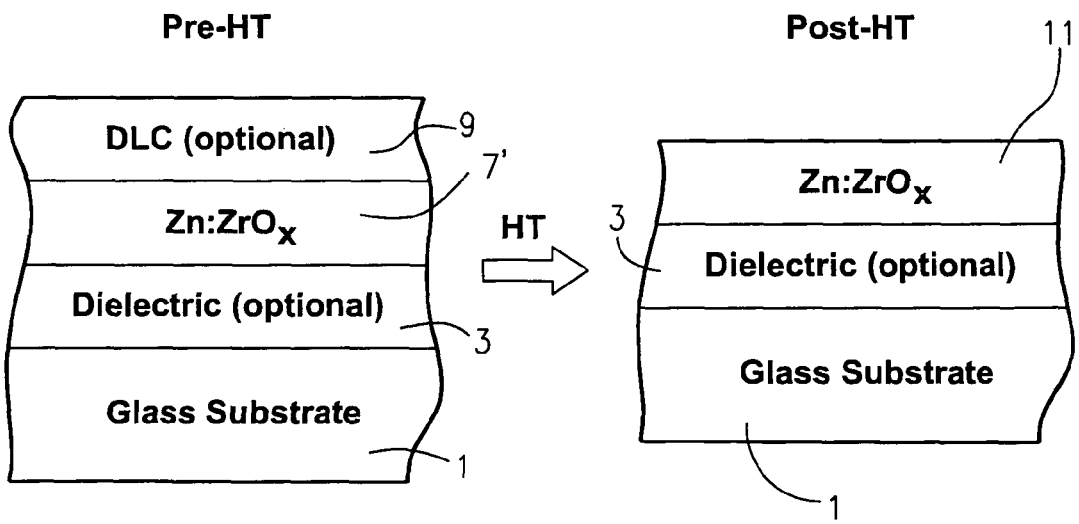
FIG. 2 is a schematic diagram illustrating cross-sections of coated articles according to another embodiment of this invention before and after heat treatment.

FIG. 2 illustrates another example embodiment according to this invention. The FIG. 2 embodiment is similar to the FIG. 1 embodiment, except that pre-HT Zn-doped zirconium nitride layer 7 of the FIG. 1 embodiment has been replaced with a Zn-doped zirconium oxide layer 7' in the FIG. 2 embodiment. The thicknesses, Zr contents, Zn contents, ratios, etc. discussed above with respect to layer 7 also apply to layer 7' in the FIG. 2 embodiment. In other words, the FIG. 2 embodiment is the same as the FIG. 1 embodiment except that the nitrogen in layer 7 has been replaced (or supplemented) with oxygen. The post-HT layer 11 in the FIG. 2 embodiment is the same as that described above with respect to the FIG. 1 embodiment. This is because the HT causes both Zn:ZrO$_x$ (see 7' in FIG. 2) and Zn:ZrN$_x$ (see 7 in FIG. 1) to transform into a more dense and less absorbing Zn:ZrO$_x$ top layer 11 as shown in FIGS. 1-2.

Figure 3:
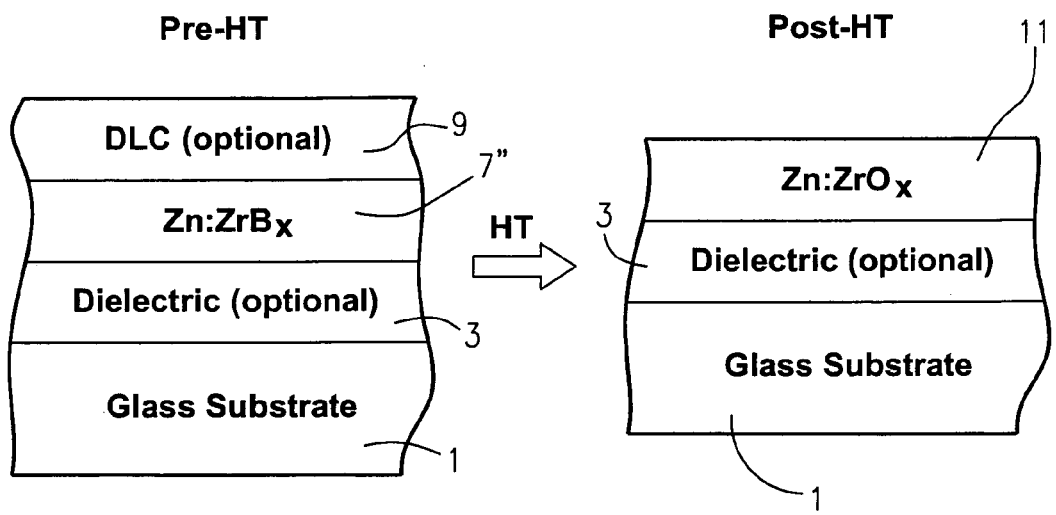
FIG. 3 is a schematic diagram illustrating cross-sections of coated articles according to an embodiment of this invention before and after heat treatment.

FIG. 3 illustrates another example embodiment according to this invention. The FIG. 3 embodiment is similar to the FIG. 1 embodiment, except that pre-HT Zn-doped zirconium nitride layer 7 of the FIG. 1 embodiment has been replaced with a Zn-doped zirconium boride layer 7" in the FIG. 3 embodiment. The thicknesses, Zr contents, Zn contents, ratios, etc. discussed above with respect to layer 7 also apply to layer 7" in the FIG. 3 embodiment. In other words, the FIG. 3 embodiment is the same as the FIG. 1 embodiment except that the nitrogen in layer 7 has been replaced (or supplemented) with boron. The boron in the FIG. 3 embodiment (like the nitrogen in the FIG. 1 embodiment and the oxygen in the FIG. 2 embodiment) may be supplied via gas used in the sputter-deposition process of the layer. The post-HT layer 11 in the FIG. 3 embodiment is the same as that described above with respect to the FIG. 1 embodiment. This is because the HT causes both Zn:ZrB$_x$ (see 7" in FIG. 3) and Zn:ZrN$_x$ (see 7 in FIG. 1) to transform into a more dense and less absorbing Zn:ZrO$_x$ top layer 11 as shown in FIGS. 1-3. In certain example embodiments of this invention, the Zn-doped zirconium boride layer 7" may include from 0.25 to 50% B, more preferably from 1 to 50% B, and most preferably from 5 to 40% B.

Figure 4:
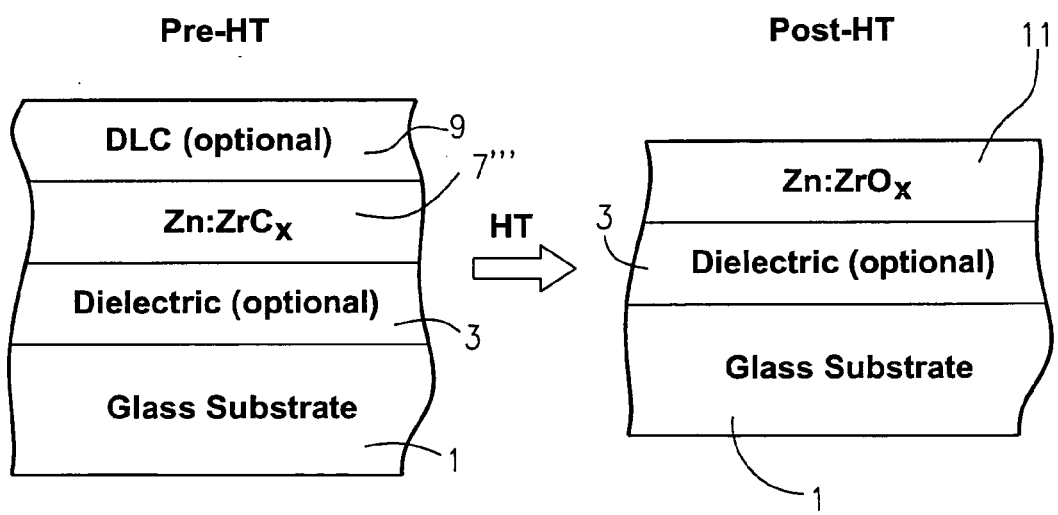
FIG. 4 is a schematic diagram illustrating cross-sections of coated articles according to another embodiment of this invention before and after heat treatment.

FIG. 4 illustrates another example embodiment according to this invention. The FIG. 4 embodiment is similar to the FIG. 1 embodiment, except that pre-HT Zn-doped zirconium nitride layer 7 of the FIG. 1 embodiment has been replaced with a Zn-doped zirconium carbide layer 7''' in the FIG. 4 embodiment. The thicknesses, Zr contents, Zn contents, ratios, etc. discussed above with respect to layer 7 also apply to layer 7''' in the FIG. 4 embodiment. In other words, the FIG. 4 embodiment is the same as the FIG. 1 embodiment except that the nitrogen in layer 7 has been replaced (or supplemented) with carbon. The carbon in the FIG. 4 embodiment (like the nitrogen in the FIG. 1 embodiment and the oxygen in the FIG. 2 embodiment) may be supplied via gas used in the sputter-deposition process of the layer, or alternatively may be supplied via an ion beam source during the deposition process. The post-HT layer 11 in the FIG. 4 embodiment is the same as that described above with respect to the FIG. 1 embodiment. This is because the HT causes both Zn:ZrC$_x$ (see 7''' in FIG. 4) and Zn:ZrN$_x$ (see 7 in FIG. 1) to transform into a more dense and less absorbing Zn:ZrO$_x$ top layer 11 as shown in FIGS. 1-4. In certain example embodiments of this invention, the Zn-doped zirconium oxide layer 11 includes from 0.25 to 50% C., more preferably from 0.25 to 10% C., and most preferably from 0.25 to 5% C.

Figure 5:
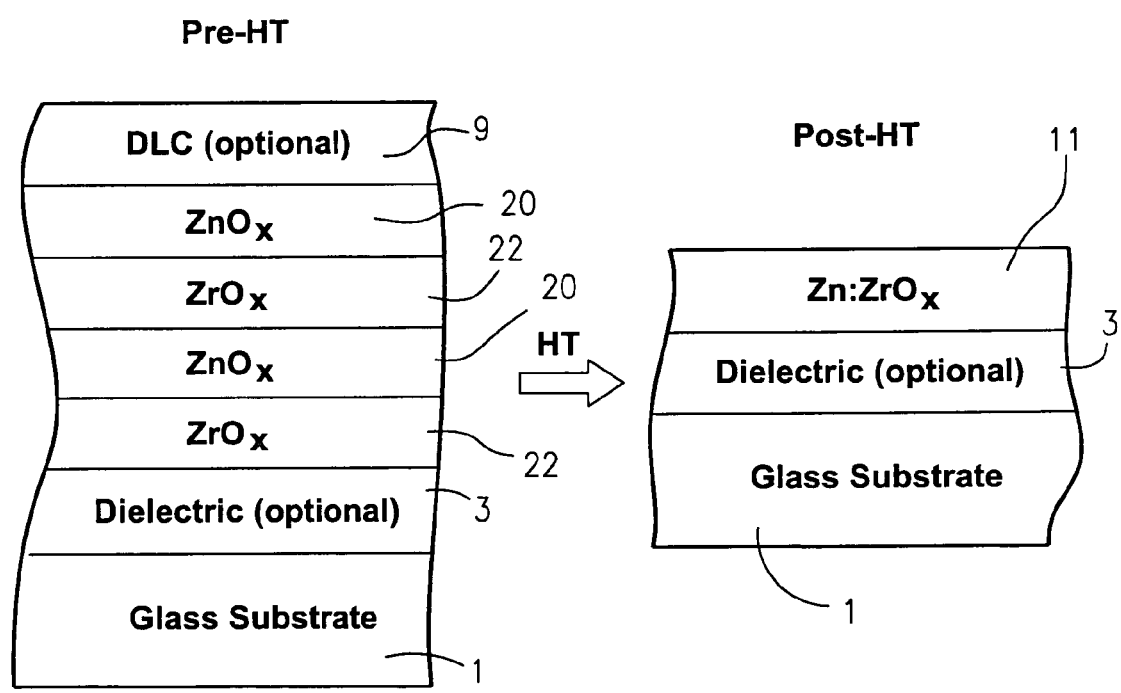
FIG. 5 is a schematic diagram illustrating cross-sections of coated articles according to another embodiment of this invention before and after heat treatment.

FIG. 5 is illustrates another example embodiment according to this invention. The FIG. 5 embodiment is similar to the FIG. 1 embodiment, except that pre-HT Zn-doped zirconium nitride layer 7 of the FIG. 1 embodiment has been replaced with a plurality of Zn and Zr based layers (e.g., Zn oxide layers, and Zr oxide layers) in the FIG. 5 embodiment. In the FIG. 5 embodiment, one or more ZnO layers and one or more ZrO layers are formed (e.g., via sputtering) on the substrate 1. Again, the barrier 3 and carbon 9 layers are optional. Thus, a plurality of discrete layers, of zinc oxide 20 and zirconium oxide 22, are provided prior to heat treatment in the FIG. 5 embodiment. Then the HT (due to the high temperatures used therein) causes diffusion between the layers 20 and 22, thereby causing the plurality of discrete layers 20, 22 to transform into a top layer 11 consisting essentially of or comprising Zn:ZrO$_x$. In other words, in the FIG. 5 embodiment the Zn-doped zirconium oxide layer 11 is made from discrete Zn and Zr containing layers 20, 22 and the mixed Zn:Zr oxide following HT is formed by diffusion which occurs during the HT.

In any of the example embodiments discussed above, one or more of the layers comprising zirconium, zinc, or Zn-doped zirconium (e.g., see layers 7, 7', 7" and/or 7''') may be doped with fluorine (F) and/or carbon (C). This may be done, for example, by using a gas such as $C_2F_6$ during sputter-deposition of the layer(s) comprising zirconium. For instance, a layer of Zn:ZrN:F may be formed by sputtering a Zr/Zn target(s) in an atmosphere including a mixture of $N_2$ and $C_2F_6$ gases (Ar gas may also be used in certain example instances in addition to $N_2$ and $C_2F_6$ gases). When $C_2F_6$ gas is used in the sputtering atmosphere, the resulting layer comprising Zn:ZrN is typically doped with both F and C since both are present in the gas. Other gases could instead be used. Surprisingly, it has been found that doping the Zn-doped zirconium based layer (e.g., 7, 7', 7" or 7''') with F and/or C prior to heat treatment tends to increase the visible transmission of the heat treated coated article. Doping with F and C unexpectedly results in a film with lower absorption compared to undoped films. Moreover, it has been found that the addition of F and/or C to these layers does not significantly change the optics of the coated article, or the biaxial film stress of the films prior to HT. Furthermore, when F and/or C are provided in layer 7, 7', 7" or 7''', both scratch resistance and environmental stability (e.g., measured via salt fog test) of the HT product are substantially unaffected by the presence of F and/or C. Of course, following heat treatment the layer comprising Zn-doped zirconium oxide 11 may also be doped with F and/or C in a corresponding manner since it was present before HT. This doping of Zn-doped zirconium oxide and/or nitride with F and/or C may be used in conjunction with any embodiment discussed herein. In certain example embodiments of this invention, one or more of layers 7, 7', 7", 7''', and/or 11 may be doped with from about 0.01 to 10.0% F, more preferably from about 0.1 to 8.0% F, even more preferably from about 0.3 to 5.0% F, still more preferably from about 0.4 to 2% F, and most preferably from about 0.5 to 1.0% F (in terms of atomic percent). Moreover, in certain example embodiments of this invention, one or more of these layers may be doped with from about 0.01 to 10.0% C, more preferably from about 0.1 to 8.0% C, even more preferably from about 0.3 to 5.0% C, still more preferably from about 0.4 to 2% C, and most preferably from about 0.5 to 1.0% C (in terms of atomic percent). The doping with F and C may be used together so that one or more of these layers is/are doped with both F and C in these amounts. Alternatively, only one of the dopants F and C may be used for a layer. Thus, in such alternative embodiments, one or more of these layers 7, 7', 11 and 11' may be doped with F in the aforesaid amount(s), but not doped with C. As yet another alternative, one or more of these layers may be doped with C in the aforesaid amount(s), but not doped with F.

In certain example embodiments of this invention, good scratch resistance can also be realized by doping the Zn-doped zirconium based layer (e.g., one or more of 7, 7', 7", 7''', 22 and/or 11) with a mixture of Zn/Sn and/or a mixture of Zn/Cu. This may, for example, be done in forming the zirconium inclusive layer (7, 7', 7", 7''' and/or 22) prior to HT, with the doping material makings its way into the post-HT layer 11 as well. Thus, in certain example embodiments, the Zn-doped zirconium oxide based layer 11 may also include amounts of Sn and/or Cu. In certain example instances, in addition to the Zn doping material discussed herein, the amount of Sn and/or Cu in the layer (7, 7', 7", 7''', 11 and/or 22) may be from about 0-10%, more preferably from about 0-8%, even more preferably from about 0.5-8%, possibly from about 1-5%.

Each of the aforesaid embodiments provides for a heat treatable coated article that is very scratch resistant and corrosion resistant following HT. For example, post-HT coated articles according to certain embodiments of this invention may have a critical scratch load using a 3 mm borosilicate sphere of at least about 15 lbs., more preferably at least 18 lbs., even more preferably at least 20 lbs., still most preferably at least 22.5 lbs., and most preferably at least 30 lbs. Additionally, coated articles according to certain example embodiments of this invention are UV stable, and do not significantly degrade upon UV exposure. In certain example embodiments, coated articles herein may have a post-HT contact angle θ with a sessile drop of water of from about 25 to 60 degrees; and sometimes the contact angle is less than 35 degrees.

Another aspect of certain example embodiments of this invention is the extreme increase in visible transmission caused by heat treatment. In certain example embodiments, visible transmission increases by at least about 20 visible transmission % due to HT, more preferably at least 30%, and most preferably at least 40%. For example, in certain examples of this invention that have been made, the pre-HT visible transmission has been about 36-37%.

Any suitable type of glass substrate 1 may be used in different embodiments of this invention. For example, various types of soda lime silica glass or borosilicate glass may be used for substrate 1. However, in certain example embodiments of this invention, the coating of any of the aforesaid embodiments may be supported by a special type of glass substrate that has a very high visible transmission and a very clear color. In particular, in such certain example embodiments of this invention, the glass substrate 1 may be any of the glasses described in commonly owned U.S. patent application Ser. No. 10/667,975, the disclosure of which is hereby incorporated herein by reference. In certain preferred embodiments, the resulting glass has visible transmission of at least 85%, more preferably at least 88%, and most preferably at least 90% (e.g., at a reference thickness of about 0.219 inches or 5.56 mm). The advantage of using such a glass substrate 1 is that the resulting HT product is caused to have a visual appearance similar to that of uncoated clear glass— even though the coating is provided thereon. In addition to the base glass, examples of the glass batch and/or final glass are set forth below (in terms of weight percentage of the total glass composition, unless otherwise listed as ppm):

Example Colorants and Oxidizer Cerium in Glass Substrate

| Ingredient | General | Preferred | More Preferred | Best |
|---|---|---|---|---|
| total iron (Fe$_2$O$_3$): | 0.01-0.20% | 0.01-0.15% | 0.02-0.12% | 0.03 to 0.10% |
| cobalt oxide: | 0 to 15 ppm | 0.1 to 10 ppm | 0.5 to 5 ppm | 0.5 to 3 ppm |
| cerium oxide: | 0.005-1.0% | 0.01-1.0% | 0.01-0.5% | 0.05 to 0.2% |
| erbium oxide: | 0 to 1.0% | 0.01-0.30% | 0.02-0.20% | 0.02 to 0.15% |
| titanium oxide: | 0 to 0.5% | 0 to 0.2% | 0.001 to 0.05% | 0.01 to 0.02% |
| chromium oxide: | 0 to 10 ppm | 0 to 8 ppm | 0 to 5 ppm | 1 to 5 ppm |
| glass redox: | <=0.20 | <=0.12 | <=0.10 | <=0.08 |
| % FeO: | 0.0001-0.05% | 0.0001-0.01% | 0.001-0.008% | 0.001-0.003% |

It is noted that in other embodiments of this invention, additional layers (not shown) may be added to the coated articles discussed above, and/or certain layer(s) may be deleted. As mentioned above, layers 3 and 9 are optional.

EXAMPLES

For purposes of example, and without limitation, the following example coated articles were made and tested according to example embodiments of this invention. FIG. 6 lists Comparative Examples (CEs) CE1-CE8, and Examples 1-4 according to certain example embodiments of this invention. Comparative Examples CE1 and CE2 are simply a 6 mm thick clear float glass substrate 1 uncoated (CE1), and a 6 mm thick float glass substrate 1 coated with only 140 angstroms of silicon nitride 3 (CE2). No Zr or Zn inclusive layers were present in CE1 and CE2. Comparative Examples CE3 and CE4 were made by sputter-depositing a zirconium oxide layer (420 angstroms thick) on CE1 and CE2, respectively. CE5, CE6, CE7 and CE8 were made by sputter-depositing a 30 angstrom thick zinc oxide layer on CE1, a 35 angstrom thick zinc oxide layer on CE2, a 415 angstrom thick zinc oxide layer on CE1, and a 365 angstrom thick zinc oxide layer on CE2, respectively.

Meanwhile, Example 1 was made by sputter-depositing a 84 angstrom thick Zn-doped zirconium oxide layer 7' on CE1 (i.e., sputter-depositing such a Zn-doped zirconium oxide layer 7' directly onto and contacting a 6 mm thick clear glass substrate 1). Example 2 was made by sputter-depositing a 118 angstrom (Å) thick Zn-doped zirconium oxide layer 7' on CE2 (i.e., sputter-depositing such a Zn-doped zirconium oxide layer 7' onto a 6 mm thick clear glass substrate 1 with a silicon nitride layer 3 provided therebetween as shown in FIG. 2). Example 3 was made by sputter-depositing a 340 angstrom thick Zn-doped zirconium oxide layer 7' on CE1 (i.e., sputter-depositing such a Zn-doped zirconium oxide layer 7' directly onto and contacting a 6 mm thick clear glass substrate 1). Example 4 was made by sputter-depositing a 370 angstrom (Å) thick Zn-doped zirconium oxide layer 7' on CE2 (i.e., sputter-depositing such a Zn-doped zirconium oxide layer 7' onto a 6 mm thick clear glass substrate 1 with a silicon nitride layer 3 provided therebetween as shown in FIG. 2). FIG. 6 compares the performance of the coatings of Examples 1-4 to control or comparative examples CE1-CE8. All samples were heat treated to simulate tempering (700 degrees C. for about four minutes). After HT, all sample were cleaned with Windex. Scratch resistance reported in FIG. 6 was measured via Linear Taber using a 3 mm borosilicate sphere. Corrosion testing was performed by a preliminary five minutes dip of each sample in vinegar followed by a one hour exposure of the sample to 0.1N NaOH at room temperature, followed by a one hour exposure of the sample to 5% HCl. Tvis % in FIG. 6 represents the visible transmission of the coated article after heat treatment.

FIG. 6 illustrates that the coated articles of Examples 1-4 had a much better scratch resistance than did the coated articles of CE3-CE4 which had a pure zirconium oxide coating (not doped with Zn) on the glass substrate. Thus, it can be seen that the addition of the Zn to the Zr oxide layer unexpectedly improved the scratch resistance of the coated article. Moreover, FIG. 6 also shows that the coated articles of Examples 1-4 had much better corrosion resistance than did the coated articles of CE5-CE8 which had a pure zinc oxide coating (no Zr included) on the glass substrate; this is evidenced by the fact that the zinc oxide coatings of CE5-CE8 entirely disappeared or dissolved during the corrosion testing (see zero thickness after corrosion testing in the far right column of FIG. 6 for CE5-CE8, compared to the rather thick top layers of Zn-doped zirconium oxide remaining after the corrosion testing for Examples 1-4). Thus, it can be seen that the mixture of Zn and Zr in layers 7, 7', 7'', 7''' and top layer 11 unexpectedly improved the corrosion resistance of the coated article compared to coated articles with pure zinc oxide coatings as the top layer.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

The invention claimed is:

1. A coated article comprising:
   a glass substrate; and
   a layer comprising Zn-doped zirconium oxide ($Zn:Zr_xO_y$) provided as an outermost layer of a coating provided on the glass substrate, where y/x is from about 1.2 to 2.5 and there is more Zr than Zn in the layer comprising Zn-doped zirconium oxide, and metal content of the layer comprising Zn-doped zirconium oxide is from about 5-25% Zn.

2. The coated article of claim 1, wherein the coating consists only of the layer comprising Zn-doped zirconium oxide.

3. The coated article of claim 1, wherein the coated article is heat treated.

4. The coated article of claim 1, wherein a layer comprising silicon oxide and/or silicon nitride is provided on the glass substrate between the glass substrate and the layer comprising the Zn-doped zirconium oxide.

5. The coated article of claim 1, wherein the layer comprising Zn-doped zirconium oxide further comprises F and/or C.

6. The coated article of claim 1, wherein the layer comprising zinc-doped zirconium oxide comprises a nanocrystalline cubic lattice structure.

7. The coated article of claim 1, wherein the layer comprising zinc-doped zirconium oxide has a Zr:Zn ratio of from about 40:1 to 1.5:1.

8. The coated article of claim 1, wherein the layer comprising zinc-doped zirconium oxide has a Zr:Zn ratio of from about 10:1 to 5:1.

9. The coated article of claim 1, wherein glass substrate is tempered and the coated article has a visible transmission of at least about 70%.

10. The coated article of claim 1, wherein the coated article has a critical scratch load using a borosilicate sphere of at least about 20 lbs., more preferably at least about 25 lbs., still more preferably at least about 30 lbs.

11. The coated article of claim 1, wherein the layer comprising zinc-doped zirconium oxide is capable of withstanding a corrosion test comprising: (a) a preliminary five minute dip in vinegar followed by (b) a one hour exposure to 0.1N NaOH at room temperature followed by (c) a one hour exposure to 5% HCl, without entirely dissolving.

12. The coated article of claim 1, wherein the layer comprising zinc-doped zirconium oxide further comprises Sn.

13. The coated article of claim 1, wherein the layer comprising zinc-doped zirconium oxide further comprises Cu.

14. The coated article of claim 1, wherein the coated article consists essentially of the glass substrate and the layer comprising Zn-doped zirconium oxide, optionally with one dielectric layer provided therebetween.

\* \* \* \* \*